United States Patent
Almekhyal

(10) Patent No.: US 12,413,233 B1
(45) Date of Patent: Sep. 9, 2025

(54) 4-BIT SYNCHRONOUS COUNTER IC WITH RIPPLE CARRY-OUT, LOADING CAPABILITY, AND INTEGRATED MOD-10 RESET FUNCTIONALITY

(71) Applicant: KUWAIT UNIVERSITY, Safat (KW)

(72) Inventor: Abdullah S. Almekhyal, Safat (KW)

(73) Assignee: KUWAIT UNIVERSITY, Safat (KW)

( * ) Notice: Subject to any disclaimer, the term of this patent is extended or adjusted under 35 U.S.C. 154(b) by 0 days.

(21) Appl. No.: 19/226,394

(22) Filed: Jun. 3, 2025

(51) Int. Cl.
H03K 21/00 (2006.01)
H03K 21/10 (2006.01)
H03K 21/38 (2006.01)

(52) U.S. Cl.
CPC ............. H03K 21/38 (2013.01); H03K 21/10 (2013.01)

(58) Field of Classification Search
CPC ........ H03K 21/00; H03K 21/38; H03K 21/10; H03K 21/12; H03K 21/40; H03K 21/16; H03K 21/18; H03K 23/00; H03K 23/40; H03K 23/42; H03K 23/425; H03K 23/48; H03K 23/54; H03K 23/542; H03K 23/66; H03K 23/665; H03K 23/667; H03K 23/72
See application file for complete search history.

(56) References Cited

U.S. PATENT DOCUMENTS

| | | | | |
|---|---|---|---|---|
| 4,264,864 A * | 4/1981 | Takeda | ................. | H03K 21/026 377/110 |
| 5,454,018 A | 9/1995 | Hopkins | | |
| 5,719,798 A * | 2/1998 | Lutz | ....................... | H03K 23/40 377/126 |
| 6,057,719 A * | 5/2000 | Austin | ................. | H03K 23/665 377/52 |
| 6,282,255 B1 * | 8/2001 | La Rosa | .............. | H03K 23/544 377/47 |
| 6,434,588 B1 * | 8/2002 | Kim | ........................ | G06F 7/607 708/672 |
| 6,545,508 B2 | 4/2003 | Senba | | |
| 6,859,020 B2 | 2/2005 | Baldwin et al. | | |
| 7,126,371 B2 | 10/2006 | Nakano et al. | | |

(Continued)

FOREIGN PATENT DOCUMENTS

JP      5308279 B2 *  10/2013  ............. C04B 28/02

OTHER PUBLICATIONS

Texas Instruments, "SN54160 Thru SN54163, SN54LS160A Thru SN54LS163A, SN54S162, SN54S163, SN74160 Thru SN74163, SN74LS160A Thru SN74LS163A, SN74S162, SN74S163 Synchronous 4-BIT Counters", Oct. 1976 revised Mar. 1988.

(Continued)

Primary Examiner — Tuan T Lam
(74) Attorney, Agent, or Firm — Nath, Goldberg & Meyer; Joshua B. Goldberg

(57) ABSTRACT

A multi-bit binary counter outputs a predetermined binary number of bits reflecting a number of times of triggering an input pin, and providing a binary counter output having a decimal equivalent. A multi-bit binary counter is implemented as a multi-bit synchronous counter IC chip with a ripple carry-out pin and loading functionality. An active output count indication pin is connected to cause the IC to transition states, such as from a HIGH state to a LOW state, when the counter output's decimal equivalent exceeds single-digit numbers. In one configuration, the counter functions selectively as a MOD-10 (decade) or MOD-16 binary counter.

10 Claims, 6 Drawing Sheets

(56) References Cited

U.S. PATENT DOCUMENTS

| | | | | |
|---|---|---|---|---|
| 9,900,012 B2* | 2/2018 | Cali | ................... | H03L 7/1974 |
| 10,742,220 B1* | 8/2020 | Rao | ................... | H03K 21/38 |
| 11,364,993 B2* | 6/2022 | Sumerel | ............... | G05D 1/0066 |
| 2019/0115908 A1* | 4/2019 | Prasad | ................... | H03K 5/26 |

OTHER PUBLICATIONS

"4-Bit ripple down counter using negative edge-triggered J-K flip flops", Electrical Engineering—StackExchange, published on Nov. 13, 2019.

\* cited by examiner

4-BIT SYNCHRONOUS COUNTER IC WITH RIPPLE CARRY-OUT, LOADING CAPABILITY, AND INTEGRATED MOD-10 RESET FUNCTIONALITY

BACKGROUND

Technical Field

The present disclosure relates to a multi-bit binary counter that outputs a binary number of a corresponding number of bits, reflecting the number of times an input pin has been triggered, and to configuring between two modulo of operation of such a counter without the need for extra circuitry.

Background Art

A multi-bit binary counter can be a synchronous or asynchronous counter IC chip with or without a ripple carry-out pin and loading functionality. One common binary counter circuit is a 4-bit binary counter, which outputs a 4-bit binary number reflecting the number of times an input pin has been triggered up to 15 counts.

4-bit counters used as MOD-16 counters do not require extra circuitry; however, implementation using the classical and commonly available 4-bit counter as a MOD-10 counter usually require extra circuitry. In such multi-bit counters, if an automatic reset is desired, this is classically achieved with external circuitry.

SUMMARY

A multi-bit binary counter embodied in an integrated circuit chip (IC) outputs a binary number of bits reflecting a number of times an input pin has been triggered. The multi-bit counter is implemented as a multi-bit synchronous counter IC chip with a ripple carry-out pin and loading functionality. Connections of the C10 output pin guarantees the counter reset when the output's decimal equivalent exceeds a predetermined count, for example when the counter output's decimal equivalent exceeds single-digit numbers. The active output count indication pin connection enables an automatic reset when a count exceeds a predetermined single digit to reduce system complexity.

In a particular embodiment, the active output count indication pin connection is configured as an active-low output pin connection, which transitions from HIGH to LOW when the pin is activated, for example when the count exceeds a single decimal digit, thereby rendering a count=1010. The activation occurs when the counter output's decimal equivalent exceeds predetermined single-digit numbers to enable the IC to function selectively as a MOD-10 (modulo-10 or decade), or as a MOD-16 (modulo-16) binary counter. The active-low output count indication pin connection facilitates integration with applications using MOD-10, applications using MOD-16 displays and applications using single-digit seven-segment displays. The device may function as a MOD-10 or a MOD-16 counter; however, only when the device functions as a MOD-10 counter does it facilitate integration with applications involving single-digit displays, establishing the counter as a decade counter.

Connecting the active-low output count indication pin directly to the counter's active-low CLR input pin enables automatic reset when the count exceeds a predetermined count. In this configuration, the active-low output count indication pin connection enables automatic reset when a count exceeds a predetermined single digit to reduce system complexity.

DETAILED DESCRIPTION

Overview

Terms used in the example embodiments are selected from currently widely used general terms when possible while considering the functions in the present disclosure. The terms may vary depending on the intention or precedent of a person skilled in the art, the emergence of new technology, and the like. Further, in certain cases, there are also terms arbitrarily selected by the applicant, and in the cases, the meaning will be described in detail in the corresponding descriptions. Therefore, the terms used in the present disclosure should be defined based on the meaning of the terms and the contents of the present disclosure, rather than the simple names of the terms.

Throughout the specification, when a part is described as "comprising" or "including" a component, it does not exclude another component but may further include another component unless otherwise stated.

While output and input pins are described, it is contemplated that the functions of the output and input pins can be accomplished by other types of signal points which can be used to establish binary states.

The disclosed technology provides a multi-bit binary counter. A multi-bit binary counter is a device that outputs a binary number reflecting the number of times an input pin has been triggered. As a non-limiting example, the multi-bit binary counter is configured as a 4-bit binary counter. A 4-bit binary counter is therefore a device that outputs a 4-bit binary number reflecting the number of times an input pin has been triggered.

Commonly available 4-bit counter as MOD-10 counters usually require extra circuitry. The disclosed technology facilitates using 4-bit counters as MOD-10 counters without the requirement of external circuitry.

As a non-limiting example, the disclosed techniques can be implemented as a 4-bit synchronous counter IC chip with a ripple carry-out pin and loading functionality. The disclosed technique introduces an active-low output count indication pin, designated as C10, which transitions from HIGH to LOW when the counter output's decimal equivalent exceeds single-digit numbers (i.e., when the 4-bit count reaches 1010). This feature enables the IC to function selectively as either a MOD-10 (decade) or MOD-16 binary counter, based on user configuration. The C10 pin facilitates integration with numerous applications, such as those involving single-digit seven-segment displays. A key advantage is achieved by connecting the C10 output directly to the counter's active-low CLR input pin, enabling automatic reset when the count exceeds 9. This innovation eliminates the need for additional ICs commonly required to implement similar functionality while maintaining the same 16-pin packaging, thus reducing system complexity and cost.

Figure 1:
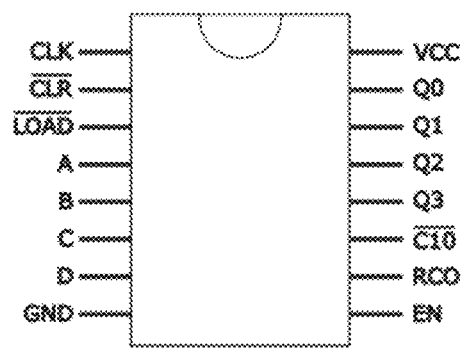
FIG. 1 is a schematic symbol and pin-out for the IC chip, packaged in a generic 16-pin DIP package.
Figure 2:
FIG. 2 is a schematic diagram showing the IC's internal logic circuitry.

FIG. 1 is a schematic symbol and pin-out for the IC chip, packaged in a generic 16-pin DIP package. FIG. 2 is a schematic diagram showing the IC's internal logic circuitry. In a non-limiting example, the present technique provides a modification of the functional design of The Texas Instruments 54161 and 74161, which are 4-bit synchronous binary counters with ripple carry-out and loading functionalities, but without the feature to optionally operate as a MOD-10 counter.

The disclosed techniques are distinguished through the use of an integrated C10-based MOD-10 reset mechanism, dual-mode capability, and direct system integration advantages. The disclosed techniques are beneficial in applications involving numerical displays, digital timers, frequency dividers, and automated counting systems. By reducing external component requirements, the present design simplifies circuit integration, lowers cost, minimizes propagation delay, and improves reliability in embedded systems. The disclosed configuration incorporates a dedicated active-low C10 pin that transitions from HIGH to LOW when the count reaches decimal 10 (binary 1010). The C10 pin can be connected directly to the CLR pin, to enable an automatic reset at 10 without requiring external logic gates or additional ICs, thereby reducing circuit complexity.

Implementation

The present disclosure builds upon the functionality of the Texas Instruments 74161 chip, enhancing its capabilities by introducing an active-low C10 output for optional MOD-10 or MOD-16 operations. The four output pins of the counter make up the binary number Q3Q2Q1Q0. The output's decimal representation corresponds to the number of input triggers, increasing by one with each trigger. A 4-bit binary number can represent $2^4=16$ states, corresponding to decimal values 0 through 15. The input is an edge-triggered pin, activated by a LOW-to-HIGH voltage transition. Commonly referred to as the CLK pin, the input pin typically receives a stream of alternating pulses, known as a clock signal, to execute sequential, precisely-timed triggers.

Thus, the disclosed circuit is capable of operating as either a MOD-10 or MOD-16 counter based on user configuration, a feature not inherently present in conventional 4-bit synchronous counters. The availability of the C10 pin directly supports seven-segment display drivers and other digital systems requiring MOD-10 counting, eliminating the need for additional logic components.

Figure 3:
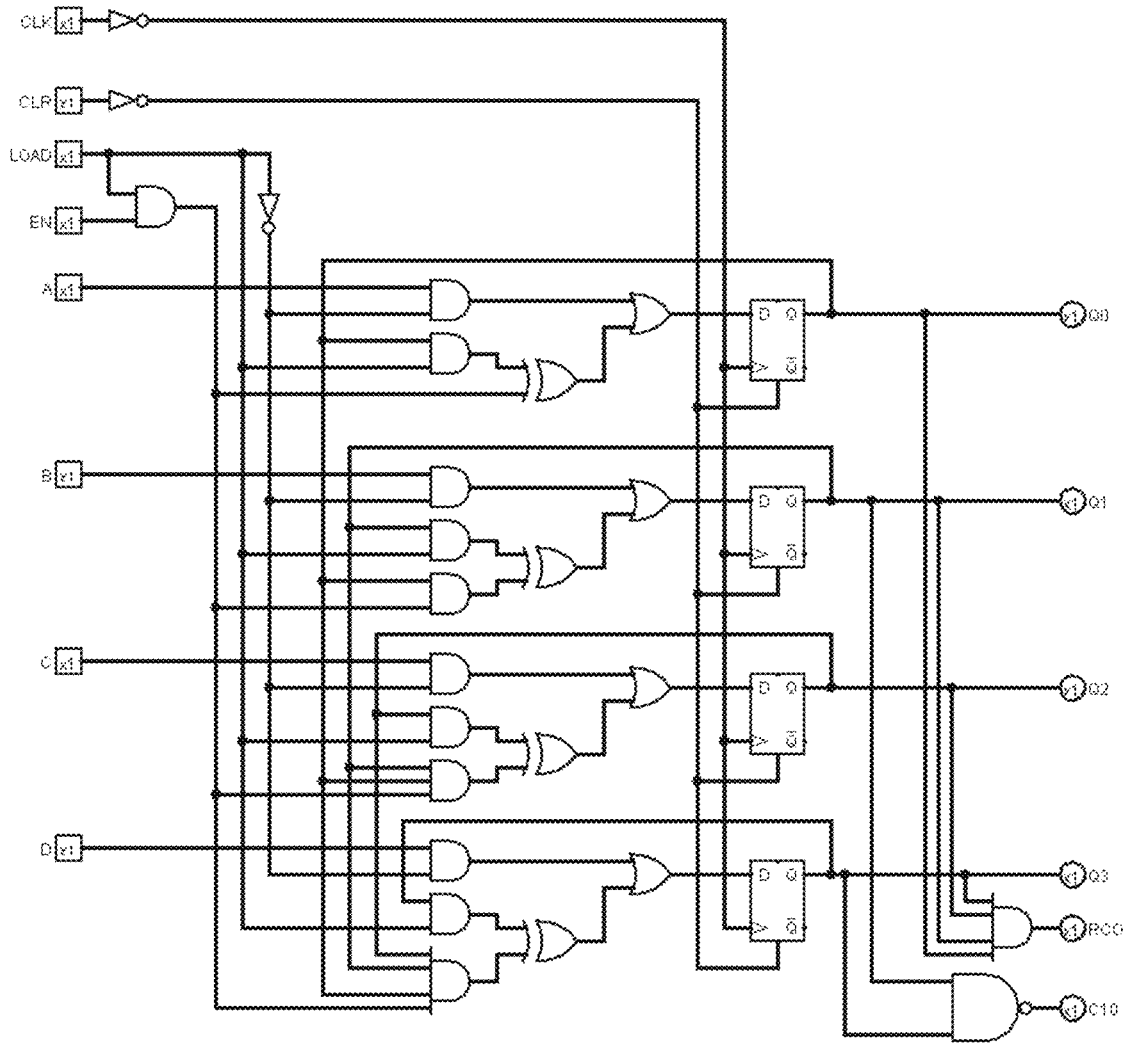
FIG. 3 is a diagram showing an example clock signal.

FIG. 3 is a diagram showing an example clock signal. In the example, there are four low-to-high transitions, which when connected to the CLK pin of the IC will trigger four counts, resulting in an output of 0100. Skipping or stopping the triggering process can be achieved by controlling the enable pin (EN), which can be set HIGH or LOW to enable or disable the counting process, respectively.

Referring to the schematic diagram of FIG. 2, to reset the count at any instance, a LOW signal is applied to the active-low CLR pin. This action resets the output instantaneously to 0000 and holds it that way until CLR state is changed to HIGH. A ripple carry-out (RCO) pin signals when the maximum count is reached. The state of the RCO pin remains LOW until the output reaches 1111, at which point it change to HIGH and resets to LOW with the next clock trigger as the counter rolls over to 0000. The RCO pin facilitates cascading multiple counters to achieve higher counts beyond the limits of a single counter. For example, if two counters, CNTR1 and CNTR2, are cascaded, with CNTR2 triggered by the CNTR1's RCO pin, CNTR2 will be counting the number of times CNTR1 has reached its maximum count. This arrangement yields a total count that is an exponential multiple of a single counter's maximum count. For two MOD-16 counters, the total count is $16^2=256$ and will increase exponentially with the number of counters cascaded together.

The pin labeled C10 signals when the count reaches a double-digit value in decimal. Its state remains HIGH for as long as the output represents a number from 0 to 9 in decimal, and switches to LOW when the output reaches 10 (1010 in binary). An active-low state has been chosen to simplify incorporation for applications requiring resetting the counter after decimal number 9, as resetting is achieved by applying a LOW signal to CLR pin. A common application for this functionality is one that includes seven-segment displays of single digit numbers.

The user can configure the device to operate as either a MOD-10 or MOD-16 counter by selectively connecting the CLR pin to either the C10 or RCO output. When the C10 pin is connected to CLR, the counter automatically resets at a count of 10, functioning as a MOD-10 counter. Conversely, connecting the RCO pin to CLR causes the counter to reset at 16, enabling MOD-16 operation.

Figure 4:
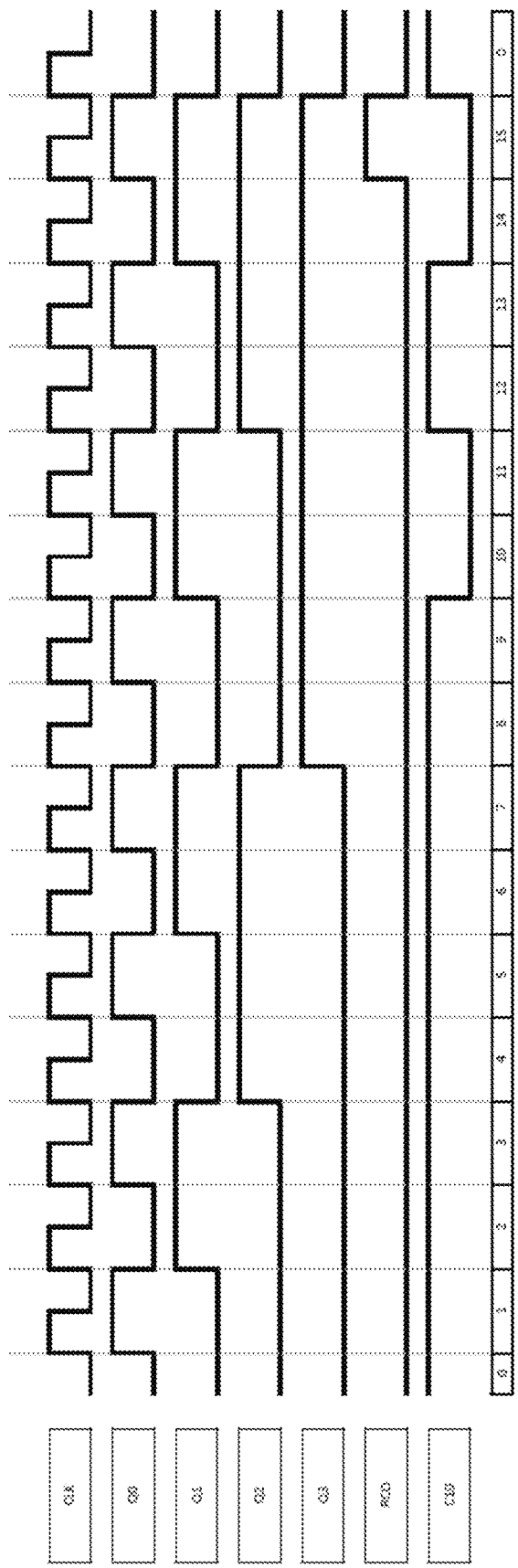
FIG. 4 is a default timing diagram showing behavior of IC chip outputs, which can be applied to the circuit of FIG. 2.

FIG. 4 is a default timing diagram showing behavior of IC chip outputs, which can be applied to the circuit of FIG. 2 To visualize the effect of CLK triggers on output pins (Q0, Q1, Q2, Q3, RCO, and C10) the following timing diagram is referenced. This assumes the LOAD, EN, and CLR pins are pulled HIGH, as shown in the timing diagram.

Also helpful in mapping the changes in output states due to various combinations of input state is the input/output Truth Table shown in Table 1:

TABLE 1

Truth Table showing behavior of outputs due to multiple clock triggers

| Decimal | Q3 | Q2 | Q1 | Q0 | RCO | C10 |
| --- | --- | --- | --- | --- | --- | --- |
| 0 | 0 | 0 | 0 | 0 | 0 | 1 |
| 1 | 0 | 0 | 0 | 1 | 0 | 1 |
| 2 | 0 | 0 | 1 | 0 | 0 | 1 |
| 3 | 0 | 0 | 1 | 1 | 0 | 1 |
| 4 | 0 | 1 | 0 | 0 | 0 | 1 |
| 5 | 0 | 1 | 0 | 1 | 0 | 1 |
| 6 | 0 | 1 | 1 | 0 | 0 | 1 |
| 7 | 0 | 1 | 1 | 1 | 0 | 1 |
| 8 | 1 | 0 | 0 | 0 | 0 | 1 |
| 9 | 1 | 0 | 0 | 1 | 0 | 1 |
| 10 | 1 | 0 | 1 | 0 | 0 | 0 |
| 11 | 1 | 0 | 1 | 1 | 0 | 0 |
| 12 | 1 | 1 | 0 | 0 | 0 | 1 |
| 13 | 1 | 1 | 0 | 1 | 0 | 1 |
| 14 | 1 | 1 | 1 | 0 | 0 | 0 |
| 15 | 1 | 1 | 1 | 1 | 1 | 0 |

Figure 5:
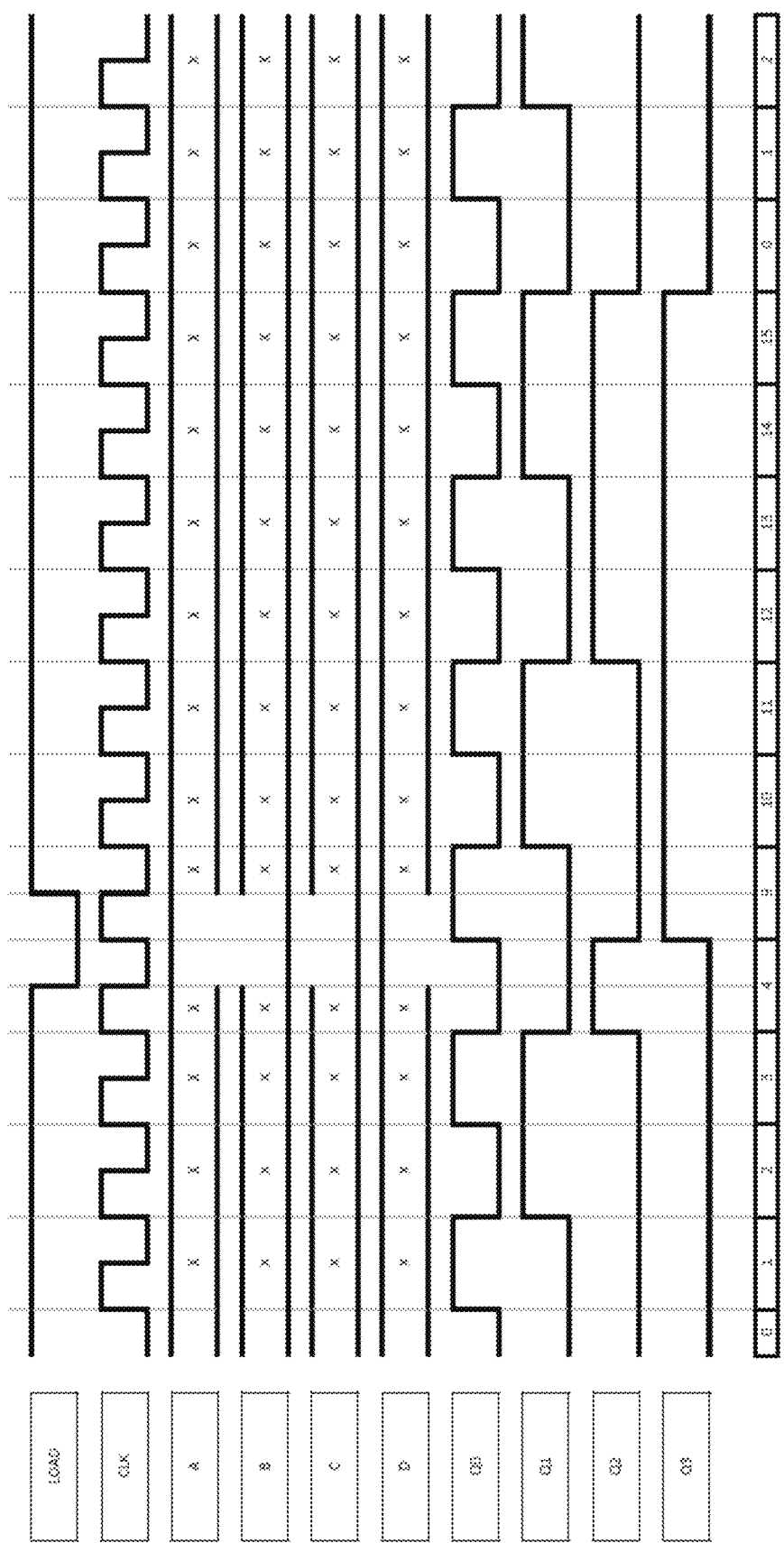
FIG. 5 is a timing diagram showing the behavior of outputs when loading is triggered.

FIG. 5 is a timing diagram showing the behavior of outputs when loading is triggered. By default, the counter IC starts counting from 0000. Despite this, the IC with this counter configuration features the ability to load a user-defined starting number. This functionality is controlled by input pins A, B, C, D and the LOAD pin. The LOAD pin is active-low and, when triggered LOW, forces the input number onto the output count indication pins at the next clock trigger. By applying the desired 4-bit binary number to the 4-bit input pins DCBA and setting LOAD to LOW, the counter will output the user-defined number on the first clock trigger, then continue counting from that value. The following timing diagram example illustrates the loading feature, setting the counter to start counting from 9 when the LOAD pin is briefly triggered LOW (EN and CLR pins are pulled HIGH).

States labeled "x" are Don't Care (DC) states, where the state of the pin is irrelevant to the device's operation. For instance, the A, B, C, and D input states are ignored when the LOAD pin is HIGH and are thus marked as DC.

Figure 6:
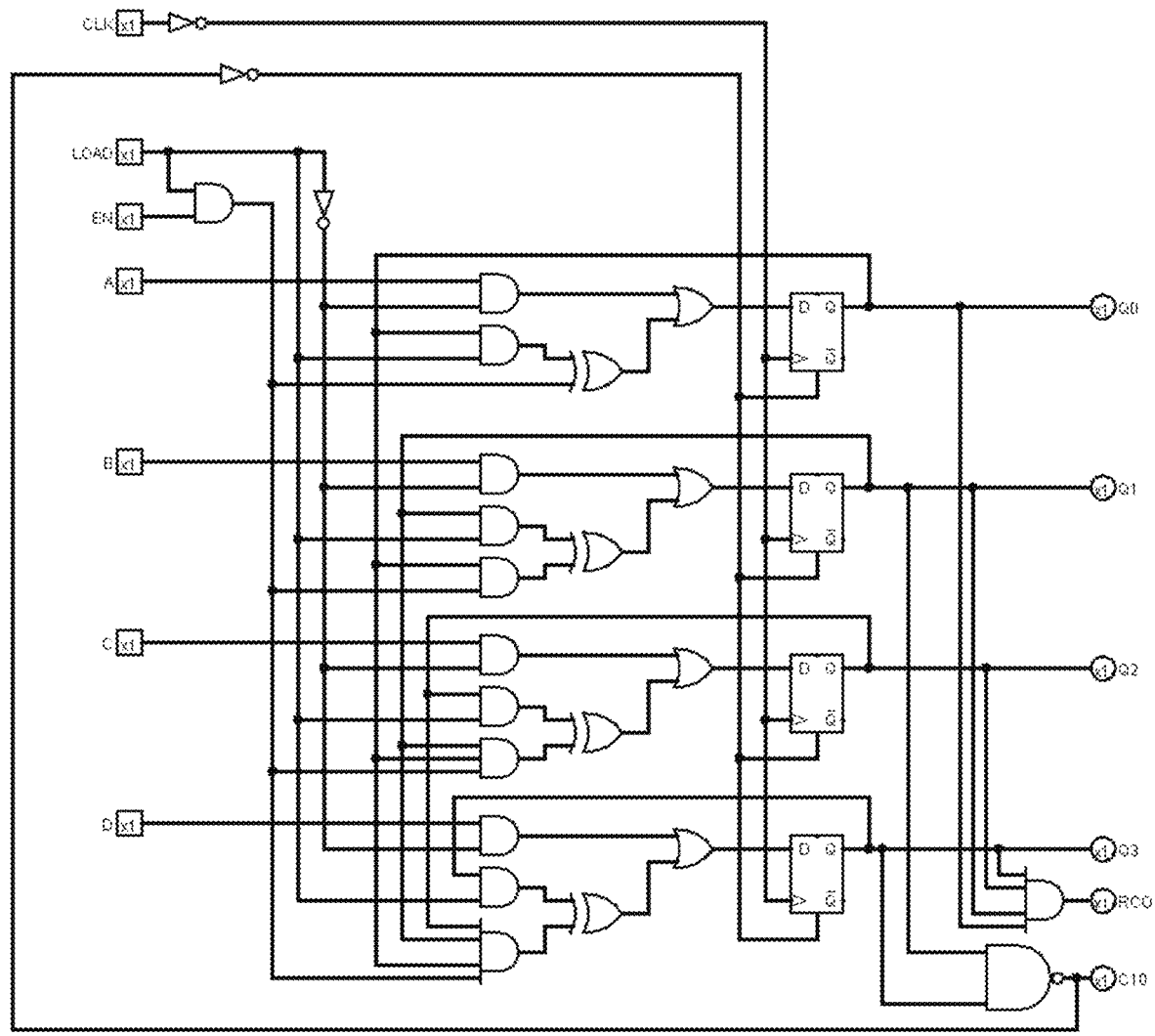
FIG. 6 is a schematic diagram showing the internal IC circuitry with an external wire connecting C10 to CLR.

FIG. 6 is a schematic diagram showing the internal IC circuitry with an external wire connecting C10 to CLR. To utilize the C10 pin for automated reset, its state can be fed back to the CLR pin. This ensures the counter resets to 0000 when the C10 pin transitions to LOW as the count reaches 1010 (decimal 10).

Figure 7:
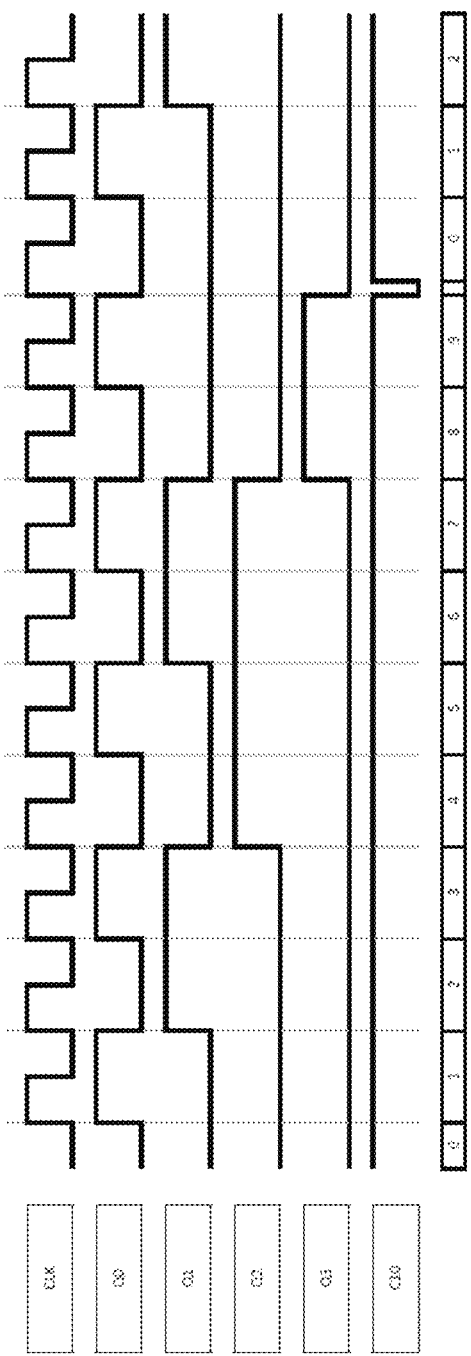
FIG. 7 is a timing diagram illustrating the IC's behavior when C10 is fed back to CLR.

FIG. 7 is a timing diagram illustrating the IC's behavior when C10 is fed back to CLR. Table 2 is a Truth Table showing the relationship between inputs and outputs when C10 state is fed-back to the CLR pin.

TABLE 2

Truth Table showing the relationship between inputs and outputs when C10 state is fed back to CLR pin in FIG. 7

| Decimal | Q3 | Q2 | Q1 | Q0 | RCO | C10 |
| --- | --- | --- | --- | --- | --- | --- |
| 0 | 0 | 0 | 0 | 0 | 0 | 1 |
| 1 | 0 | 0 | 0 | 1 | 0 | 1 |
| 2 | 0 | 0 | 1 | 0 | 0 | 1 |
| 3 | 0 | 0 | 1 | 1 | 0 | 1 |
| 4 | 0 | 1 | 0 | 0 | 0 | 1 |
| 5 | 0 | 1 | 0 | 1 | 0 | 1 |
| 6 | 0 | 1 | 1 | 0 | 0 | 1 |
| 7 | 0 | 1 | 1 | 1 | 0 | 1 |
| 8 | 1 | 0 | 0 | 0 | 0 | 1 |
| 9 | 1 | 0 | 0 | 1 | 0 | 1 |
| 10 (transient) | 1 | 0 | 1 | 0 | 0 | 0 |
| 0 | 0 | 0 | 0 | 0 | 0 | 1 |
| 1 | 0 | 0 | 0 | 1 | 0 | 1 |
| 2 | 0 | 0 | 1 | 0 | 0 | 1 |
| 3 | 0 | 0 | 1 | 1 | 0 | 1 |
| 4 | 0 | 1 | 0 | 0 | 0 | 1 |

CLOSING STATEMENT

It will be understood that many additional changes in the details, materials, steps and arrangement of parts and pinout configurations, which have been herein described and illustrated to explain the nature of the subject matter, may be made by those skilled in the art within the principle and scope of the invention as expressed in the appended claims.

What is claimed is:

1. A 4-bit synchronous counter integrated circuit (IC), comprising:
   four binary output pins configured to output a 4-bit count representing the number of input triggers;
   a clock input pin configured to increment the count on a rising edge trigger;
   a clear (CLR) input pin configured to reset the output to zero when a LOW signal is applied;
   a ripple carry-out (RCO) output pin configured to indicate when the counter output reaches a maximum binary count (16 counts);
   a load input pin configured to load a user-defined 4-bit starting value from data inputs (A, B, C, D) into the counter on the next clock pulse; and
   an active-low output pin (C10) configured to transition from HIGH to LOW when the count exceeds a single decimal digit.

2. The IC of claim 1, wherein the active-low output pin is externally connectable to the CLR pin to automatically reset the count at 1010, thereby configuring the IC to operate as a MOD-10 counter.

3. The IC of claim 1, wherein the RCO pin is externally connectable to the CLR pin to automatically reset the count at 1111 (decimal 15), thereby configuring the IC to operate as a MOD-16 counter.

4. The IC of claim 1, wherein the counter has a capability of cascading with one or more similar counters through its RCO pin to extend the counting range exponentially.

5. The IC of claim 1, wherein the active-low output pin facilitates integration with seven-segment display driver circuits requiring MOD-10 input, by signaling a reset condition when the count exceeds 9.

6. The IC of claim 1, wherein the counter operates with a standard 16-pin dual in-line package (DIP), maintaining conventional footprint compatibility while incorporating additional functionality.

7. The IC of claim 1, further comprising:
   an enable (EN) pin configured to enable or disable counting based on its logic level,
   wherein the counter's output pins (Q0-Q3) reflect a user-loaded 4-bit binary value upon activation of the load input pin, bypassing sequential counting from zero.

8. The IC of claim 1, wherein the state of the active-low output pin provides a conditionally active-low signal that enables integration with other control systems that respond to logic-level transitions for reset operations.

9. A method of operating the 4-bit synchronous counter IC of claim 1, comprising:
   connecting the active-low output pin to the CLR pin to enable automatic reset at count=1010; or
   connecting the RCO pin to the CLR pin to enable automatic reset at count=1111,
   wherein the user may select between MOD-10 and MOD-16 operation modes.

10. A multi-bit binary counter embodied in an integrated circuit chip (IC), that outputs a predetermined binary number of bits reflecting a number of times of triggering an input means, and providing a binary counter output having a decimal equivalent, the multi-bit binary counter comprising:
    the multi-bit counter implemented as a multi-bit synchronous counter IC chip with a ripple carry-out means and loading functionality; and
    active output connection means to cause the IC to transition from a HIGH state to a LOW state when the counter output's decimal equivalent exceeds single-digit numbers; and
    said active output connection means transitioning between the from a HIGH state to the LOW state when the counter output's decimal equivalent exceeds predetermined single-digit numbers to enable the IC to function selectively as a MOD10 (decade) or MOD16 binary counter,
    wherein said active output connection means facilitates integration with applications using MOD-10, applications using MOD16 displays and applications using single-digit seven-segment displays,
    wherein, said active output connection means executes a clear (CLR) signal on the counter to enable automatic reset when the count exceeds a predetermined count, and wherein said active output connection means enables automatic reset when a count exceeds a predetermined single digit to reduce system complexity.

* * * * *